US010491436B1

(12) United States Patent
Lim et al.

(10) Patent No.: US 10,491,436 B1
(45) Date of Patent: Nov. 26, 2019

(54) METHOD AND SYSTEM FOR GENERATING A MODULATED SIGNAL IN A TRANSMITTER

(71) Applicant: Xilinx, Inc., San Jose, CA (US)

(72) Inventors: Siok Wei Lim, Singapore (SG); Kee Hian Tan, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/013,049

(22) Filed: Jun. 20, 2018

(51) Int. Cl.
| | |
|---|---|
| H04L 27/04 | (2006.01) |
| H03K 17/687 | (2006.01) |
| H04L 27/06 | (2006.01) |
| H03F 3/45 | (2006.01) |
| G05F 1/56 | (2006.01) |
| H03M 9/00 | (2006.01) |
| H03H 17/06 | (2006.01) |

(52) U.S. Cl.
CPC ......... *H04L 27/04* (2013.01); *H03K 17/6872* (2013.01); *H04L 27/06* (2013.01); *G05F 1/56* (2013.01); *H03F 3/45071* (2013.01); *H03F 2200/129* (2013.01); *H03F 2200/156* (2013.01); *H03F 2203/45116* (2013.01); *H03H 17/06* (2013.01); *H03M 9/00* (2013.01)

(58) Field of Classification Search
CPC ............. H04L 25/4902; H04L 25/4917; H04L 25/028; H04L 27/04; H04L 27/06; H04L 25/03885; H03M 5/20; H03M 1/687; H03M 9/00; H04Q 2213/03
See application file for complete search history.

(56) References Cited

U.S. PATENT DOCUMENTS

| | | | |
|---|---|---|---|
| 9,674,015 B2 | 6/2017 | Kireev et al. | |
| 9,746,864 B1 | 8/2017 | Narang et al. | |
| 9,853,642 B1 | 12/2017 | Tan et al. | |
| 9,887,710 B1 | 2/2018 | Lim et al. | |
| 9,911,469 B1* | 3/2018 | Hollis | G11C 5/14 |
| 10,096,964 B1* | 10/2018 | Abdelhalim | H03M 1/1047 |
| 2005/0134305 A1* | 6/2005 | Stojanovic | H04L 25/028 326/31 |
| 2011/0150125 A1* | 6/2011 | Yu | H03M 1/68 375/295 |

(Continued)

OTHER PUBLICATIONS

Bassi, M., et al., A High-Swing 45 Gb/s Hybrid Voltage and Current-Mode PAQM-4 Transmitter in 28 nm CMOS FDSOI, IEEE Journal of Solid-State Circuits, vol. 51, No. 11, Nov. 2016, pp. 2702-2715.

*Primary Examiner* — Khanh C Tran
(74) *Attorney, Agent, or Firm* — David O'Brien; Hong Shi

(57) ABSTRACT

A driver circuit includes a driver array configured to generate, at a first output, a multi-bit output signal including a first bit associated with a predetermined first-bit amplitude and a second bit associated with a predetermined second-bit amplitude. The driver array includes first-bit driver slices coupled in parallel between a first input of first data associated with the first bit and the first output, and second-bit driver slices coupled in parallel between a second input of second data associated with the second bit and the first output. A first ratio between a first number of enabled first-bit driver slices and a second number of enabled second-bit driver slices is different from a second ratio between the predetermined first-bit amplitude and the predetermined second-bit amplitude.

20 Claims, 12 Drawing Sheets

(56) References Cited

U.S. PATENT DOCUMENTS

| | | | | |
|---|---|---|---|---|
| 2015/0085914 A1* | 3/2015 | Kizer | .................. | H04L 27/06 |
| | | | | 375/233 |
| 2015/0187441 A1* | 7/2015 | Hollis | .................. | G11C 29/36 |
| | | | | 714/719 |
| 2016/0013958 A1* | 1/2016 | Mishra | .................. | H04L 25/06 |
| | | | | 375/287 |
| 2018/0091335 A1* | 3/2018 | Schnizler | ............ | H04L 25/4917 |
| 2018/0366898 A1* | 12/2018 | Abdelhalim | .......... | H01S 3/0912 |

\* cited by examiner

| Regulator Mode | Swing (V) | Vrefp (V) | Vrefn (V) | Common Mode (V) |
|---|---|---|---|---|
| Dual | 0.6 | 0.75 | 0.15 | 0.45 |
| Dual | 0.9 | 0.9 | 0 | 0.45 |
| Single | 1 | 1 | 0 | 0.5 |
| Single | 0.9 | 0.9 | 0 | 0.45 |

FIG. 5

METHOD AND SYSTEM FOR GENERATING A MODULATED SIGNAL IN A TRANSMITTER

TECHNICAL FIELD

Examples of the present disclosure generally relate to integrated circuits ("ICs") and, in particular, to an embodiment related to generating a modulated signal in a transmitter.

BACKGROUND

Data transmission speed and quality are important for data communication systems and networks. Data may be transmitted according to various data transmission protocols. Multi-level signal modulation, such as pulse-amplitude modulation (PAM), is used for enhancing data rate in bandwidth limited data communication channels. An important parameter of a transmitter is the linearity of the output signal generated by the transmitter. Based on the linearity of the output signal, it may be determined that the deviation of each signal level in the output signal from the corresponding expected value is small, and therefore that an expected value of a particular signal level may be derived from positions of other signal levels. The linearity of the output signal may affect the performance (e.g., the bit error rate of received data) of data transmission.

Accordingly, it would be desirable and useful to provide an improved method and system for generating a modulated signal in a transmitter.

SUMMARY

In some embodiments, a driver circuit includes a driver array configured to provide, at a first output, a multi-bit output signal including a first bit associated with a predetermined first-bit amplitude and a second bit associated with a predetermined second-bit amplitude. The driver array includes a first plurality of first-bit driver slices coupled in parallel between a first input of first data associated with the first bit of the multi-bit output signal and the first output; and a second plurality of second-bit driver slices coupled in parallel between a second input of second data associated with the second bit of the multi-bit output signal and the first output. A first ratio between a first number of enabled first-bit driver slices and a second number of enabled second-bit driver slices is different from a second ratio between the predetermined first-bit amplitude and the predetermined second-bit amplitude.

In some embodiments, the driver circuit includes a control circuit configured to: change an operating mode of a first programmable driver slice between an enabled mode and a disabled mode to control a linearity of the multi-bit output signal. The first programmable driver slice is one of a first-bit driver slice and a second-bit driver slice.

In some embodiments, the control circuit is configured to change an operating mode of a second programmable driver slice between an enabled mode and a disabled mode to control the linearity of the multi-bit output signal. The second programmable driver slice is the other of the first-bit driver slice and the second-bit driver slice.

In some embodiments, the control circuit is configured to change an operating mode for each programmable driver slice of a first group of programmable driver slices between an enabled mode and a disabled mode. The first group of programmable driver slices includes a third number of programmable first-bit driver slices and a fourth number of programmable second-bit driver slices. A third ratio between the third number and the fourth number equals the second ratio.

In some embodiments, the multi-bit output signal is a pulse-amplitude modulation (PAM) signal.

In some embodiments, the driver circuit includes a control circuit is configured to: determine that a first ratio of level mismatch (RLM) of the multi-bit output signal is below an RLM threshold, and in response, adjust the first ratio between the first number of enabled first-bit driver slices and the second number of enabled second-bit driver slices.

In some embodiments, the multi-bit output signal is a PAM-4 signal. The first bit is a most significant bit (MSB) of the multi-bit output signal. The second bit is a least significant bit (LSB) of the multi-bit output signal. The second ratio is 2:1.

In some embodiments, the first RLM is determined based on a smallest eye amplitude of an eye diagram of the multi-bit output signal and a peak-to-peak amplitude of the eye diagram.

In some embodiments, the first ratio is greater than the second ratio.

In some embodiments, the first ratio is less than the second ratio.

In some embodiments, a method includes receiving, by a first plurality of first-bit driver slices coupled in parallel between a first input and a first output from the first input, first data associated with a first bit of a multi-bit output signal; receiving, by a second plurality of second-bit driver slices coupled in parallel between a second input and the first output from the second input, second data associated with a second bit of a multi-bit output signal; and providing, at the first output, the multi-bit output signal including the first bit associated with a predetermined first-bit amplitude and the second bit associated with a predetermined second-bit amplitude. A first ratio between a first number of enabled first-bit driver slices and a second number of enabled second-bit driver slices is different from a second ratio between the predetermined first-bit amplitude and the predetermined second-bit amplitude.

In some embodiments, the method includes changing an operating mode of a first programmable driver slice between an enabled mode and a disabled mode to control a linearity of the multi-bit output signal. The first programmable driver slice is one of a first-bit driver slice and a second-bit driver slice.

In some embodiments, the method includes changing an operating mode of a second programmable driver slice between an enabled mode and a disabled mode to control the linearity of the multi-bit output signal. The second programmable driver slice is the other of the first-bit driver slice and the second-bit driver slice.

In some embodiments, the method includes changing an operating mode for each programmable driver slice of a first group of programmable driver slices between an enabled mode and a disabled mode. The first group of programmable driver slices includes a third number of programmable first-bit driver slices and a fourth number of programmable second-bit driver slices. A third ratio between the third number and the fourth number equals the second ratio.

In some embodiments, the method includes determining that a first ratio of level mismatch (RLM) of the multi-bit output signal is below an RLM threshold, and in response, adjusting the first ratio between the first number of enabled first-bit driver slices and the second number of enabled second-bit driver slices.

In some embodiments, the method includes determining the first RLM based on a smallest-eye amplitude of an eye diagram of the multi-bit output signal and a peak-to-peak amplitude of the eye diagram.

Other aspects and features will be evident from reading the following detailed description and accompanying drawings.

BRIEF DESCRIPTION OF THE DRAWINGS

FIG. 5 is a table illustrating characteristics of high-swing mode low-swing mode for both dual voltage regulators and a single regulator according to some embodiments of the present disclosure.

DETAILED DESCRIPTION

Figure 1:
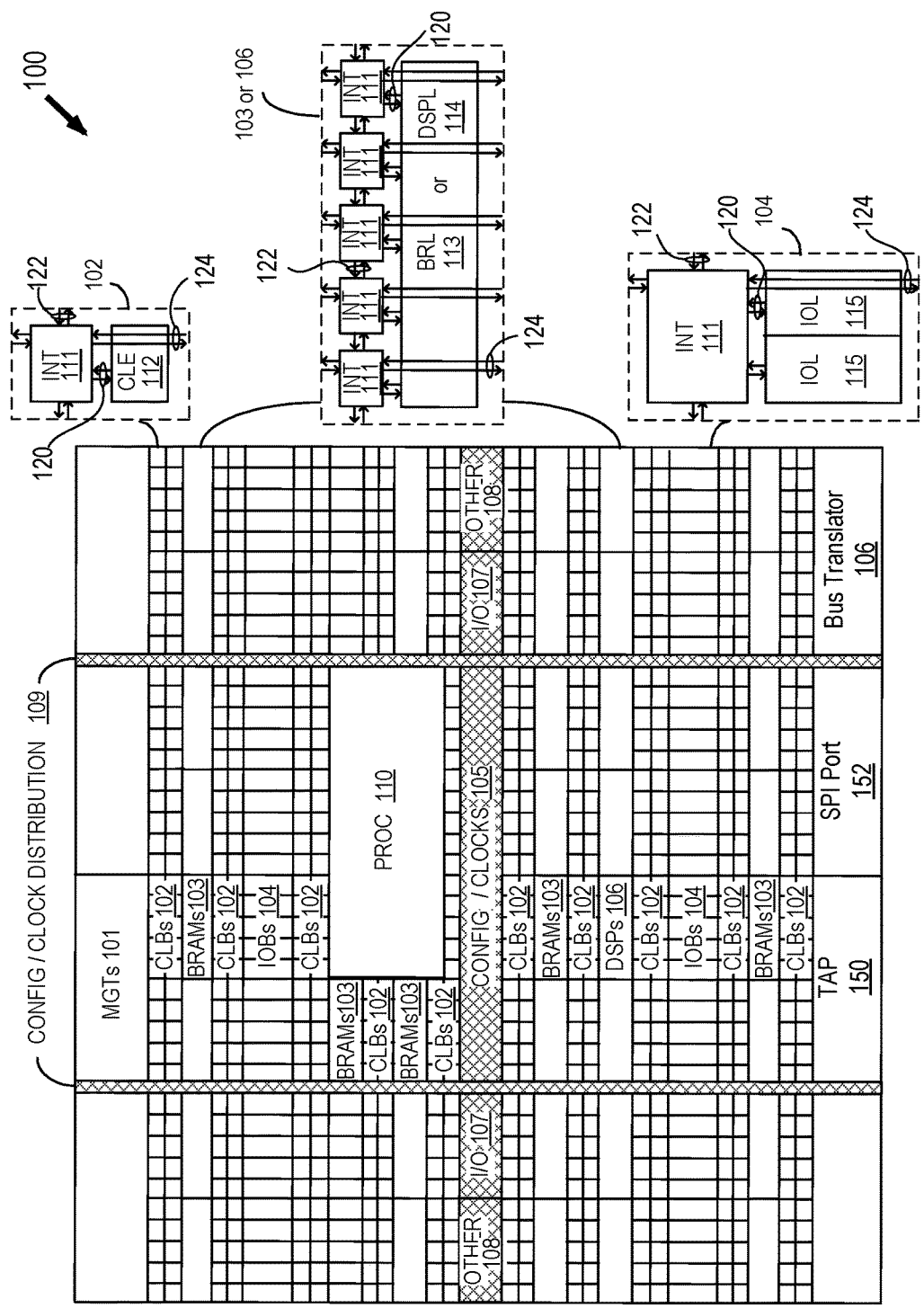
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, an important parameter of a transmitter is the linearity of the output signal generated by the transmitter. A Ratio of Level Mismatch (RLM) may be used to measure the linearity of the transmitter, where the RLM is determined based on a smallest-eye amplitude of an eye diagram of the output signal and a peak-to-peak amplitude of the eye diagram. Usually, the numbers of driver slices in driver arrays for different bits (e.g., MSB, LSB) of the multi-bit output signal have the same ratio as the expected amplitude ratio of those bits (e.g., 2:1 for a PAM4 output signal).

For integrated circuit (IC) solutions, it has been discovered that, by controlling the driver arrays of a voltage-mode output driver such that the driver arrays for different bits (e.g., MSB, LSB) have a driver slice number ratio different from the expected amplitude ratio of those bits, RLM may be improved.

Various advantages may be present in various applications of the present disclosure. No particular advantage is required for all embodiments, and different embodiments may offer different advantages. One of the advantages of some embodiments is that by independently controlling MSB driver slice(s) and LSB driver slice(s), RLM of an output signal of the output driver is improved. Another of the advantages of some embodiments is that only a portion (e.g., 10% or less) of driver slices are implemented as programmable driver slices (e.g., by using additional NAND and NOR gates) while other driver slices are not programmable between enable and disable modes, which reduces the cost of the additional gates and driving force needed. Yet another of the advantages of some embodiments is that coarse impedance of the output driver may be controlled by disabling/enabling a group of programmable driver slices including both MSB driver slice(s) and LSB driver slice(s).

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multigigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more of the embodiments described herein is not limited to the exemplary IC depicted in FIG. 1, and that IC having other configurations, or other types of IC, may also implement those embodiments.

Figure 2:
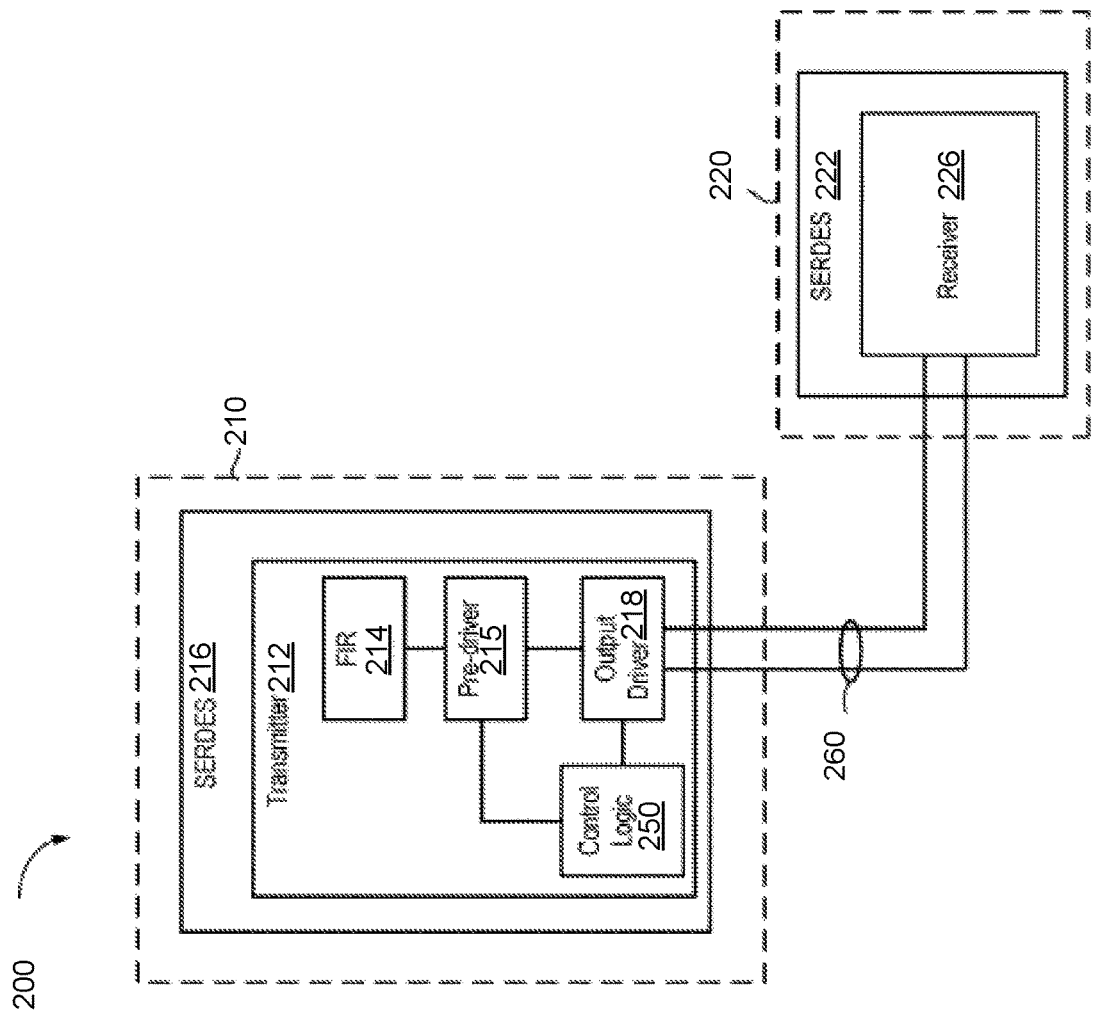
FIG. 2 is a block diagram depicting an example of a serial communication system according to some embodiments of the present disclosure.

FIG. 2 is a block diagram depicting an example of a serial communication system 200. The serial communication system 200 includes a transmitter 212 coupled to a receiver 226 over transmission medium 260. The transmitter 212 can be part of a serializer-deserializer (SERDES) 216. The receiver 226 can be part of a SERDES 222. The transmission medium 260 includes an electrical path between the transmitter 212 and the receiver 226, and may include printed circuit board (PCB) traces, vias, cables, connectors, decoupling capacitors, and the like. In an example, the transmission medium 260 includes a matched pair of transmission lines each having a characteristic impedance ($Z_0$). In some examples, the SERDES 216 may include a receiver, and the SERDES 222 may include a transmitter. In some examples, the SERDES 216 is disposed in an integrated circuit (IC) 210, and the SERDES 222 is disposed in an IC 220.

In some embodiments, the transmitter 212 generates a serial data signal from a parallel data path (serialization). The serial data signal has a particular data rate (symbol rate). In some examples, data bytes from the parallel data path may be encoded prior to serialization using, for example, an 8B/10B encoder or the like. The transmitter 212 drives the serial data signal onto the transmission medium 260 using a digital modulation technique, such as binary non-return-to-zero (NRZ), pulse amplitude modulation (PAM), and other suitable modulation. The transmission medium 260 propagates electrical signal(s) representing symbols of the serial data signal (e.g., logic "1" and logic "0") towards the receiver 226.

As shown in FIG. 2, in some embodiments, the transmission medium 260 is a differential channel. Data on the differential channel is represented using two electrical signals ("true" and "complement" signals). In an example, a logic "0" is represented by driving the true signal to its lower voltage limit and driving the complement signal to its upper voltage limit. A logic "1" is represented by driving the true signal to its upper voltage limit and driving the complement signal to its lower voltage limit. Thus, the logic value of each transmitted symbol is based on the difference between the true and complement signals. The peak-to-peak difference between the true signal and the complement signal is the voltage swing (also referred to as signal swing or swing).

The transmitter 212 includes a finite impulse response (FIR) filter 214, a pre-driver 215, an output driver 218, and control logic 250. The transmitter 212 is configured to equalize the serial data signal prior to transmission over the transmission medium 260. The FIR 214 may be used to mitigate inter-symbol interference (ISI) caused by the transmission medium 260. The transmission medium 260 degrades the signal quality of the transmitted signal. Channel insertion loss is the frequency-dependent degradation in signal power of the transmitted signal. When signals travel through a transmission line, the high frequency components of the transmitted signal are attenuated more than the low frequency components. In general, channel insertion loss increases as frequency increases. Signal pulse energy in the transmitted signal can be spread from one symbol period to another during propagation on the transmission medium 260. The resulting distortion is known as 151. In general, 151 becomes worse as the speed of the communication system increases.

The output of the FIR filter 214 is coupled to an input of the pre-driver 215. The output of the FIR filter 214 can include a plurality of signals, including a main-cursor signal, and one or more pre-cursor signals, one or more post-cursor signals, or a plurality of post-cursor and pre-cursor signals. In an example, the FIR filter 214 outputs one main-cursor signal, one pre-cursor signal, and one post-cursor signal. The pre-driver 215 is configured to couple the output of the FIR filter 214 to the output driver 218. As discussed below, the output driver 218 may include a plurality of output circuits coupled in parallel to the transmission medium 260. The pre-driver 215 couples each of the main-cursor, the pre-cursor, and the post-cursor signals to a selected percentage of the output circuits of the output driver 218. The percentages of output circuits driven by the main-cursor, pre-cursor, and post-cursor signals as selected by the pre-driver 215 are controlled by the control logic 250. The control logic 250 also controls various aspects of the output driver 218, as discussed further below.

While the SERDES 216 and the SERDES 222 are used as examples, in other examples, each of the transmitter 212 and/or the receiver 226 may be a stand-alone circuit. In some examples, the transmitter 212 and the receiver 226 can be part of one or more integrated circuits (ICs), such as application specific integrated circuits (ASICs) or programmable ICs, such as field programmable gate arrays (FPGAs).

Figure 3:
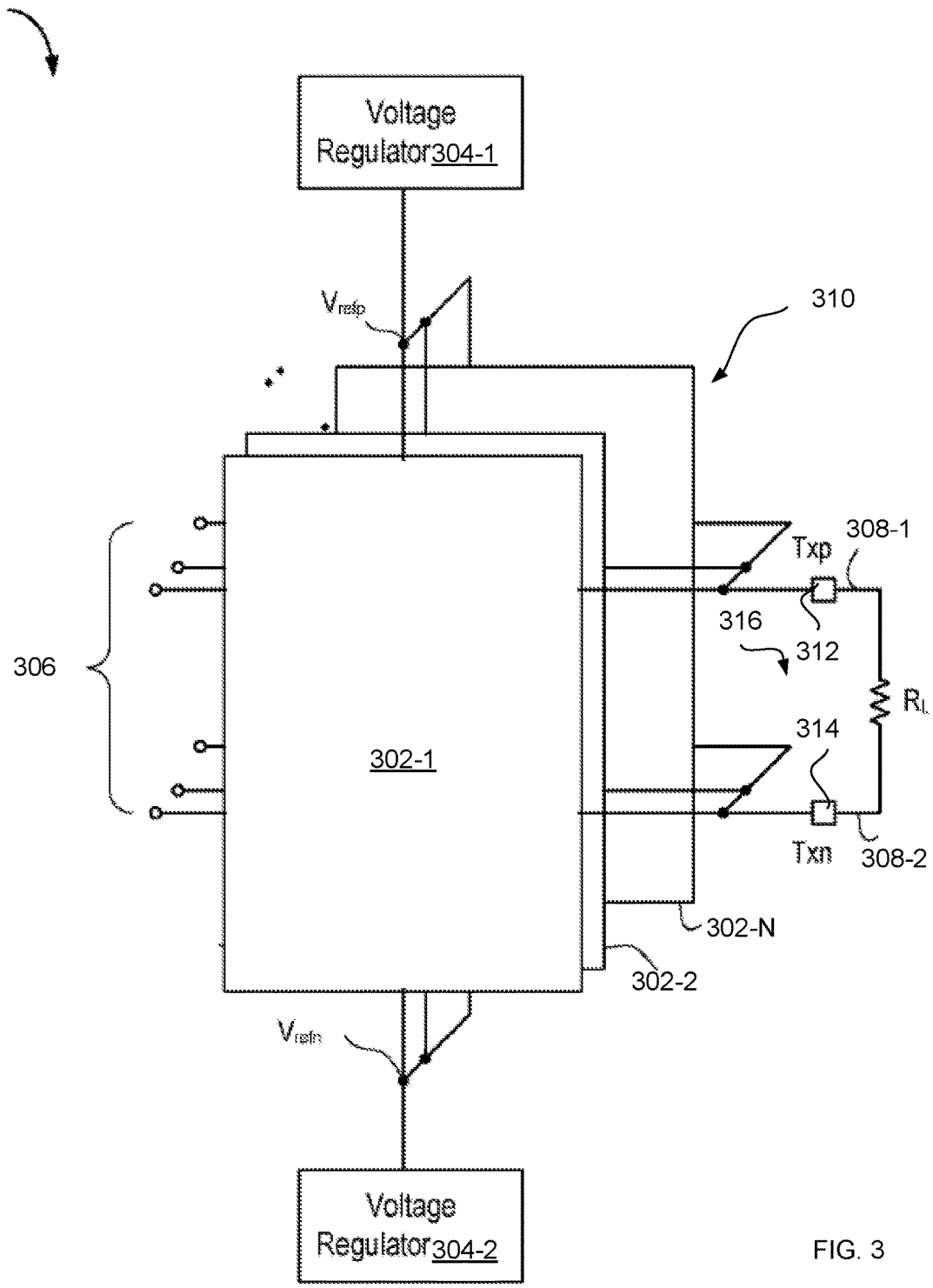
FIG. 3 is a block diagram depicting an example of an output driver according to some embodiments of the present disclosure.

Referring to FIG. 3, an example of an output driver 218 (e.g., an output driver 218 of FIG. 2) is illustrated. The output driver 218 includes output circuits 302-1 through 302-N (where N is an integer greater than one) and voltage regulators 304-1 and 304-2. The output circuits 302-1 through 302-N are collectively referred to as driver array 310. Each output circuit of the driver array 310 may also be referred to as a driver slice 302-i. The voltage regulators 304-1 and 304-2 are collectively referred to as voltage regulators 304.

The output circuits 302 are coupled in parallel between a differential input 306 (e.g., from a pre-driver 215 of FIG. 2) and a differential output (Txp, Txn). The differential input 306 includes N differential signals output by the pre-driver 215. Each differential signal may include a true signal and a complement signal.

The output circuits 302 are coupled to common nodes $V_{refp}$ and $V_{refn}$. The voltage regulator 304-1 is coupled to the common node $V_{refp}$. The voltage regulator 304-1 controls the voltage at the node $V_{refp}$ and supplies current to the output circuits 302. The voltage regulator 304-2 is coupled to the common node $V_{refn}$. The voltage regulator 304-2 controls the voltage at the node $V_{refn}$ and sinks current from the output circuits 302.

The differential output 316 includes output ends 312 (Txp) and 314 (Txn), and is coupled to a pair of transmission lines 308-1 and 308-2 (collectively transmission lines 308). The transmission lines 308 drive a load resistance RL. The transmission lines 308 may be part of the transmission medium 260 and the load resistance RL may be part of the receiver 226.

Figure 4A:
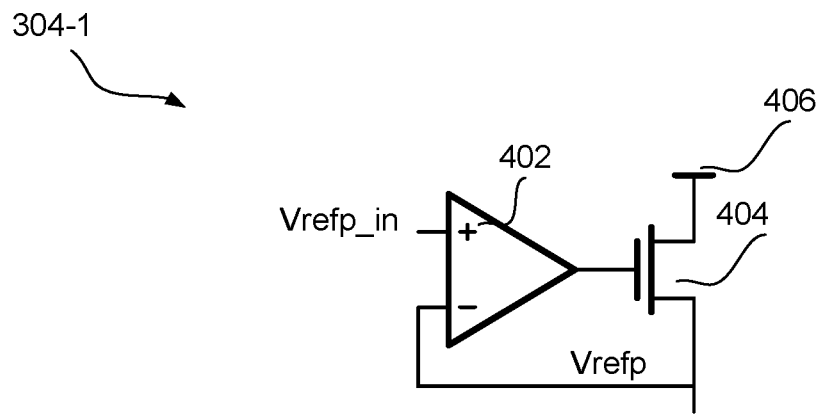
FIG. 4A is a block diagram depicting an example of a voltage regulator according to some embodiments of the present disclosure.
Figure 4B:
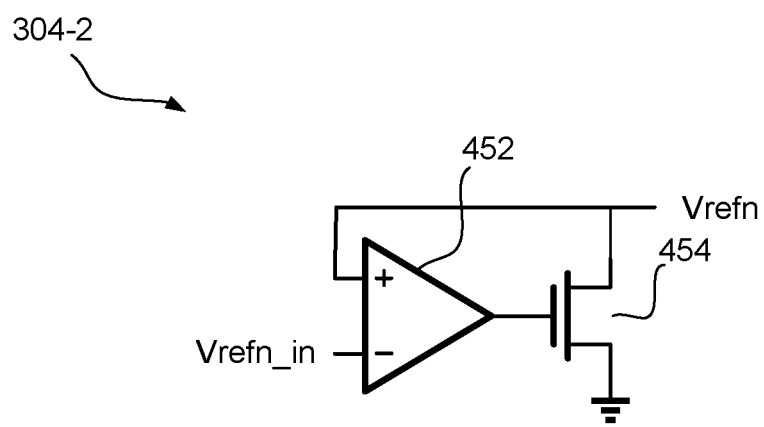
FIG. 4B is a block diagram depicting another example of a voltage regulator according to some embodiments of the present disclosure.

Referring to FIGS. 4A and 4B, examples of voltage regulators 304-1 and 304-2 are illustrated. Referring to FIG. 4A, a voltage regulator 304-1 may include an operational amplifier 402 and a transistor 404. The transistor 404 may be an n-channel FET, such as an N-type MOSFET. A non-inverting input terminal of the operational amplifier 402 is coupled to a first reference voltage source (Vrefp_in). An inverting input of the operational amplifier 402 is coupled to the node Vrefp. A drain of the transistor is coupled to a supply voltage source 406. A source of the transistor 404 is coupled to the node Vrefp. A gate of the transistor 404 is coupled to an output of the operational amplifier 402.

Referring to FIG. 4B, a voltage regulator 304-2 includes an operational amplifier 452 and a transistor 454. The transistor 454 may be an n-channel FET, such as an N-type MOSFET. A non-inverting input terminal of the operational amplifier 452 is coupled to a second reference voltage source Vrefn_in. An inverting input of the operational amplifier 452 is coupled to the node Vrefn. A source of the transistor 454 is coupled to a ground voltage source. A drain of the transistor 454 is coupled to the node Vrefn. A gate of the transistor 454 is coupled to an output of the operational amplifier 452.

The voltage regulators 304 set the swing of the output driver 218. In an example, the differential peak-to-peak swing is Vrefp−Vrefn. In an example, the voltage regulator 304-2 may include a switch configured to short the drain of the transistor 454 to electrical ground. This allows the voltage regulator 304-2 to be disabled in one mode (high-swing mode) and enabled in another mode (low swing mode). A control signal to control the mode (e.g., by enabling/disabling the switch) may be provided by the control logic 250.

Referring to FIG. 5, table 500 illustrates characteristics of the high-swing mode and the low-swing mode for both dual regulators and a single regulator. In some embodiments, with the dual regulators 304-1 and 304-2 in the output driver 218, the swing and common-mode may be set independently. As shown in table 500 of FIG. 5, for example, the common-mode may be fixed at 0.45 V, while Vrefp and Vrefn may be set at different values.

As shown in rows 502 and 504, in a dual voltage regulator mode when both regulators 304-1 and 304-2 are enabled, the common-mode is the target 0.45 V for the low-swing mode (e.g., 0.6 V) and the high-swing mode (e.g., 0.9 V). On the other hand, as shown in rows 506 and 508, in a single voltage regulator mode, the common mode may be different (e.g., 0.5 V and 0.45 V) for the high-swing mode (e.g., 1 V) and low-swing mode (e.g., 0.9 V). As such, the use of dual regulators allows for a fixed common mode in both low- and high-swing modes. It is noted that the values in FIG. 5 are exemplary and the output driver 218 may be configured with other common-mode voltages, other high-swing voltages, and other-low-swing voltages.

In the output driver 218, equalization may be implemented by driving a different number of the output circuits 302 with different main/pre/post cursor signals. With the dual-regulator approach, the swing may be changed by adjusting the regulator voltage. Thus, equalization control is independent of the swing control. This allows for high FIR resolution even in low-swing mode.

Figure 6:
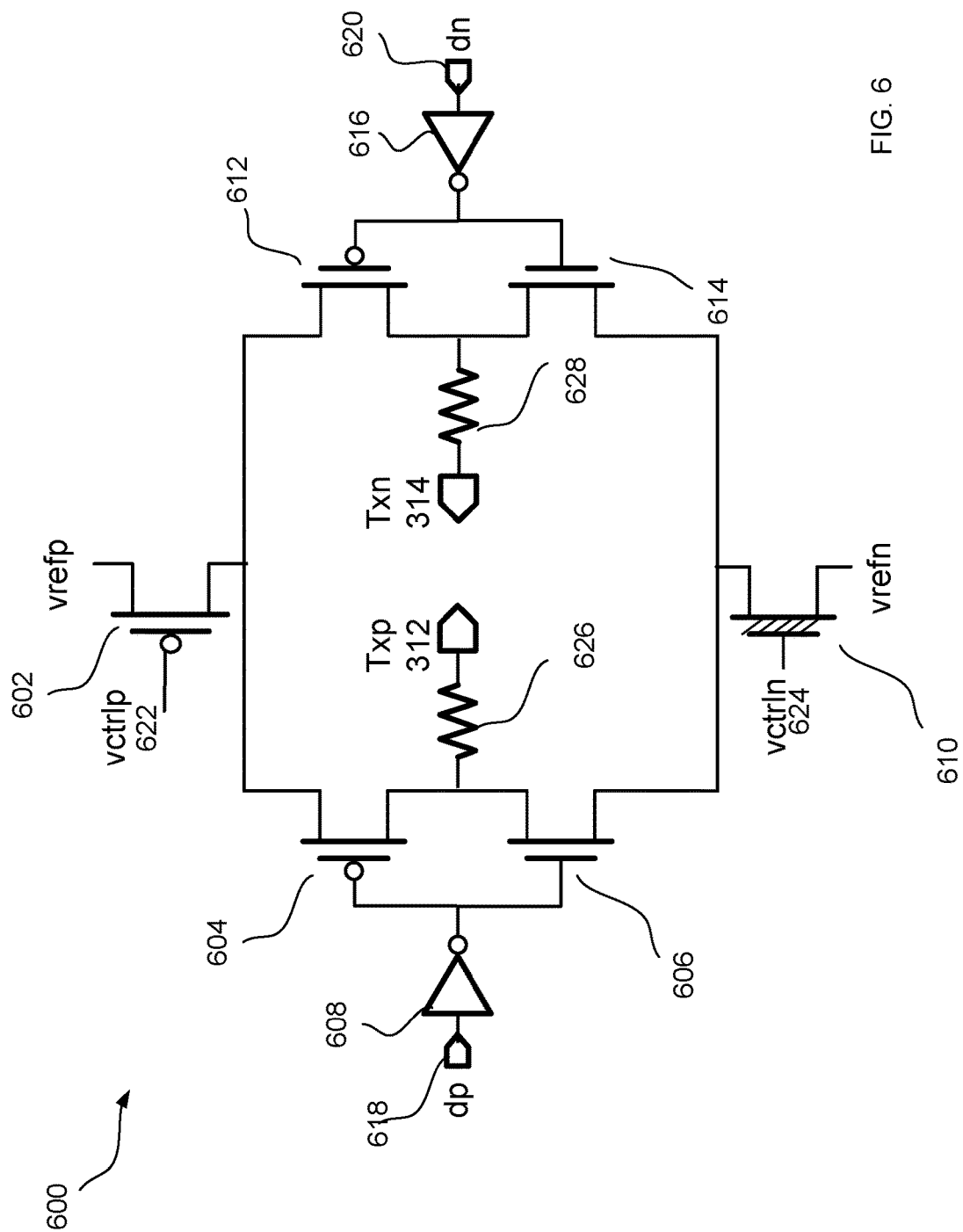
FIG. 6 is a diagram depicting an example of a fixed driver slice according to some embodiments of the present disclosure.

Referring to FIG. 6, illustrated is an example output circuit 600 (e.g., a driver slice 302-i of FIG. 3). The output circuit 600 includes transistors 602, 604, 606, 610, 612, and 614. The output circuit 600 is coupled to the common nodes $V_{refp}$ and $V_{refn}$. In an example, the output circuit 600 is coupled to the common node $V_{refp}$ through a transistor 602 (e.g., a p-channel FET), and is coupled to the common node $V_{refn}$ through a transistor 610 (e.g., an n-channel FET). The gates of the transistors 602 and 610 may be controlled by signals 622 and 624 respectively from a replica circuit. The output circuit 600 also includes resistors 626 and 628.

In the example of FIG. 6, the transistors 604 and 612 include p-channel FETs, such as P-type MOSFETs. The transistors 606 and 614 include n-channel FETs, such as N-type MOSFETs. Sources of the transistors 604 and 612 are coupled to a drain of the transistor 602. Drains of the transistors 604 and 612 are coupled to drains of the transistors 606 and 614, respectively. Sources of the transistors 606 and 614 are coupled to a drain of the transistor 610.

Gates of the transistors 604 and 606 are coupled to the output of an inverter 608. The inverter 608 includes an input for receiving one end 618 (dp) of a differential input signal. Gates of the transistors 612 and 614 are coupled to the output of an inverter 616. The inverter 616 includes an input for receiving the other end 620 (dn) of that differential input signal.

Figure 7:
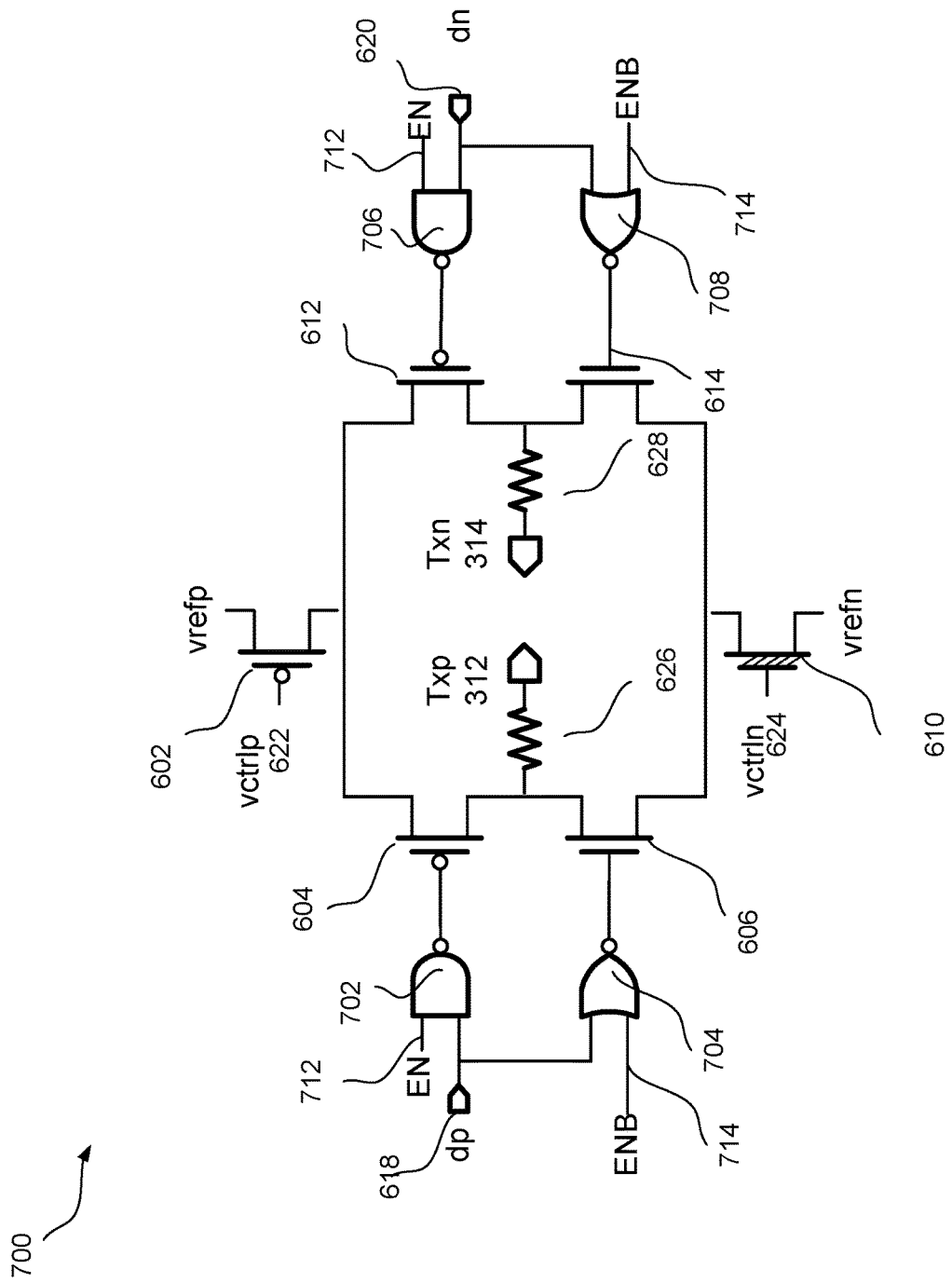
FIG. 7 is a diagram depicting an example of a programmable driver slice according to some embodiments of the present disclosure.

Referring to FIG. 7, illustrated is another example 700 of output circuit (e.g., driver slice 302-i of FIG. 3). The output circuit 700 is substantially similar to the output circuit 600 except the differences described below. Because the output circuit 700 may be programmed to operate in either enabled or disabled modes, the output circuit 700 is also referred to as programmable output circuit 700. On the other hand, because the output circuit 600 may not be programmed to operate in either enabled or disabled modes, the output circuit 600 is also referred to as fixed output circuit 600 always operating in an enabled mode.

As shown in the example of FIG. 7, by replacing inverters 608 and 616 of the output circuit 600 with NAND and NOR gates with enable control, the programmable output circuit 700 may be programmed to operate in either enabled or disabled modes. Specifically, gates of the transistors 604 and 606 are coupled to outputs of the NAND gate 702 and the NOR gate 704, respectively. First input terminals of the NAND gate 702 and the NOR gate 704 are coupled together, and are coupled to receive one end 618 (*dp*) of a differential input signal. Second inputs of the NAND gate 702 and the NOR gate 704 are coupled to a true enable signal EN 712 and a complement enable signal ENB 714 (e.g., from the control logic 250). Gates of the transistors 612 and 614 are coupled to outputs of the NAND gate 706 and the NOR gate 708, respectively. First input terminals of the NAND gate 706 and the NOR gate 708 are coupled together, and are coupled to receive the other end 620 (*dn*) of the differential input signal. Second inputs of the NAND gate 706 and the NOR gate 708 are coupled to the true enable signal EN 712 and the complement enable signal ENB 714. The true enable signal EN 712 and the complement enable signal ENB 714 may be signals provided by a control logic 250.

Figure 8:
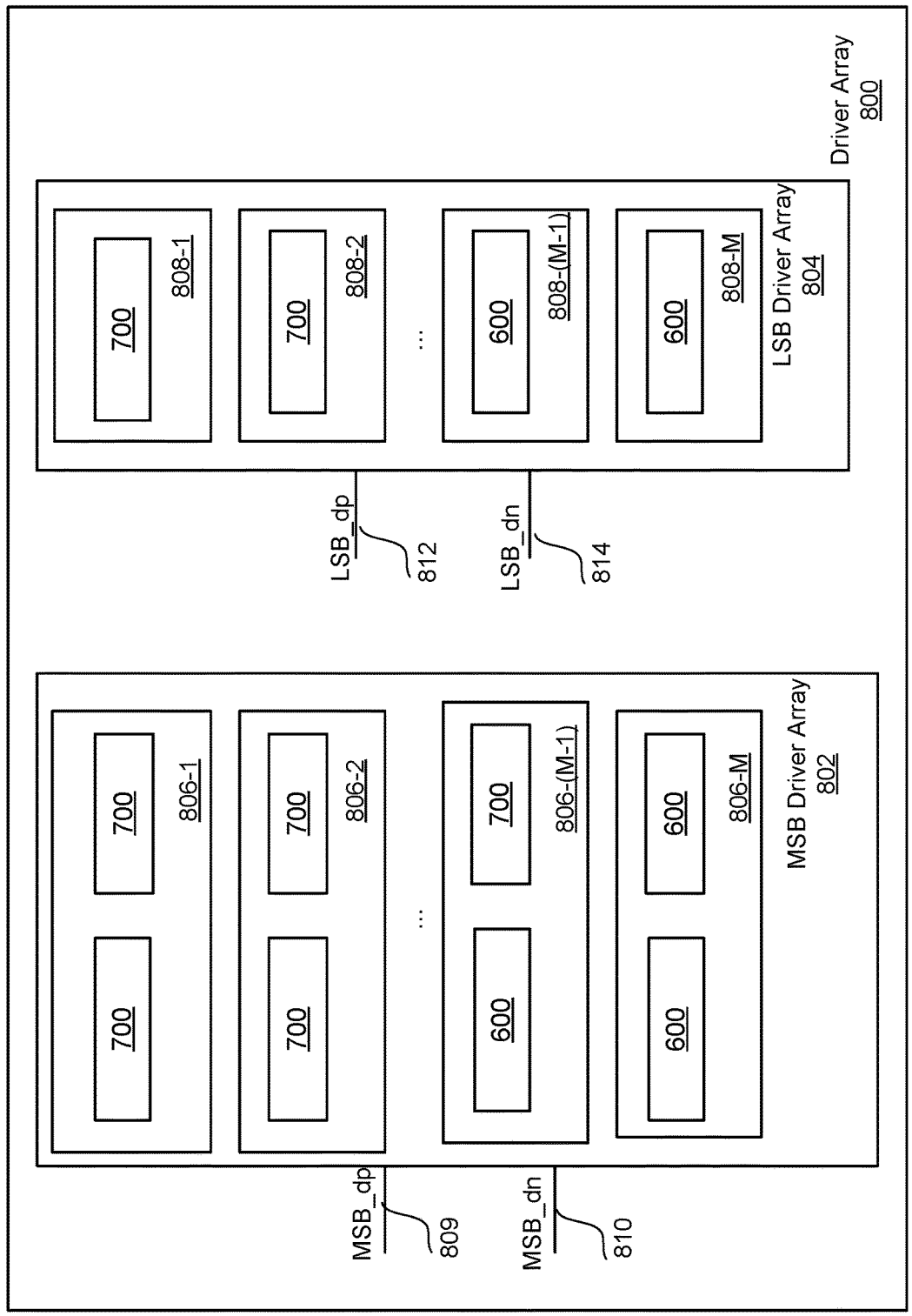
FIG. 8 is a diagram depicting an example of a driver array according to some embodiments of the present disclosure.

Referring to FIG. 8, illustrated is an exemplary driver array 800 (e.g., driver array 310) of an output driver 218. In the example of FIG. 8, the output driver 218 is a PAM4 driver for a PAM4 transmitter 212 that outputs a PAM 4 signal. The driver array 800 includes an MSB driver array 802 driven by the MSB data for the PAM4 signal, and an LSB driver array 804 driven by the LSB data for the PAM4 signal.

In the example of FIG. 8, the LSB driver array 804 includes M LSB cells 808-1 through 808-M. Because each LSB cell 808-*i* includes exactly one driver slice 302, the LSB cell 808-*i* may also be referred to as a 1× cell. The driver slices in the LSB driver array 804 may be referred to as LSB driver slices. One or more of the LSB cells may include a programmable driver slice (e.g., programmable driver slice 700 of FIG. 7), while the remaining LSB cells may include a fixed driver slice (e.g., fixed driver slice 600 of FIG. 6). Each LSB cell 808-*i* may receive at an input (e.g., an input of inverter 608, NAND gate 702, and/or NOR gate 704) one end 618 of an LSB data signal (e.g., from pre-driver 215). Each LSB cell 808-*i* may receive at another input (e.g., an input of inverter 616, NAND gate 706, and/or NOR gate 708) another end 620 of the LSB data signal (e.g., from pre-driver 215). In an example, each of the LSB cells 808-1 through 808-M includes a programmable driver slice 700, and the LSB driver array 804 does not include any fixed driver slice. In another example, only a portion (e.g., LSB cell 808-1 and 808-2) of the LSB cells includes a programmable driver slice 700, while the remaining portion (e.g., LSB cells 808-3 through 808-M) of the LSB cells include fixed driver slice.

In the example of FIG. 8, the MSB driver array 802 includes M MSB cells 806-11 through 806-M. Because each MSB cell 806-*i* includes exactly two driver slices 302, the MSB cell 808-*i* may also be referred to as a 2× cell. The driver slices in the MSB driver array 802 may be referred to as MSB driver slices. In an example, an MSB cell (e.g., MSB cell 806-1) includes two programmable driver slices (e.g., programmable driver slice 700 of FIG. 7). In another example, an MSB cell (e.g., MSB cell 806-(M−1)) includes one programmable driver slice (e.g., programmable driver slice 700 of FIG. 7) and one fixed driver slice (e.g., fixed driver slice 600 of FIG. 6). In yet another example, an MSB cell (e.g., MSB cell 806-M) includes two fixed driver slices (e.g., fixed driver slice 600 of FIG. 6). Each MSB cell 808-*i* may receive at an input (e.g., an input of inverter 608, NAND gate 702, and/or NOR gate 704) one end 618 of an MSB data signal (e.g., from pre-driver 215). Each MSB cell 808-*i* may receive at another input (e.g., an input of inverter 616, NAND gate 706, and/or NOR gate 708) another end 620 of the MSB data signal (e.g., from pre-driver 215).

As shown in the example of FIG. 8, the total number M (e.g., 28) of MSB cells is the same as the total number M (e.g., 28) of LSB cells. Because each MSB cell includes exactly two driver slices and each LSB cell includes exactly one driver slice, in an output driver, the total number of driver slices in the driver array is 3*M (e.g., 84). a ratio between a total number of the MSB driver slices (e.g., 56) and a total number of the LSB driver slices (e.g., 28) is 2:1.

In some embodiments, the total number of slices may be adjusted (e.g., between 78, 81, 84, 87, and 90) to control the coarse impedance of the output driver 218 to compensate for on-chip resistor variation. In an example, the resistor corner is at a slow process, and the slice resistance is expected to be high. In that example, the output driver 218 may be controlled (e.g., by the control logic 250 using enable signals coupled to the programmable driver slices) to use more driver slices (e.g., from a total of 84 driver slices to a total of 90 driver slices) in the driver array 800. In another example, the resistor corner is at a fast process, and the slice resistance is expected to be low. In that example, the output driver 218 may be controlled (e.g., by the control logic 250 using enable signals coupled to the programmable driver slices) to use fewer driver slices (e.g., from a total of 84 driver slices to a total of 78 driver slices) in the driver array 800. In some embodiments, to control the coarse impedance of the output driver 218 to compensate for on-chip resistor variation, an MSB cell (including two MSB driver slices) and an LSB cell (including one LSB driver slice) are always enabled/disabled together. In other words, a group of three programmable driver slices including two MSB driver slices and one LSB driver slice are enabled and disabled together for coarse impedance control to compensate for on-chip resistor variation.

Figure 9A:
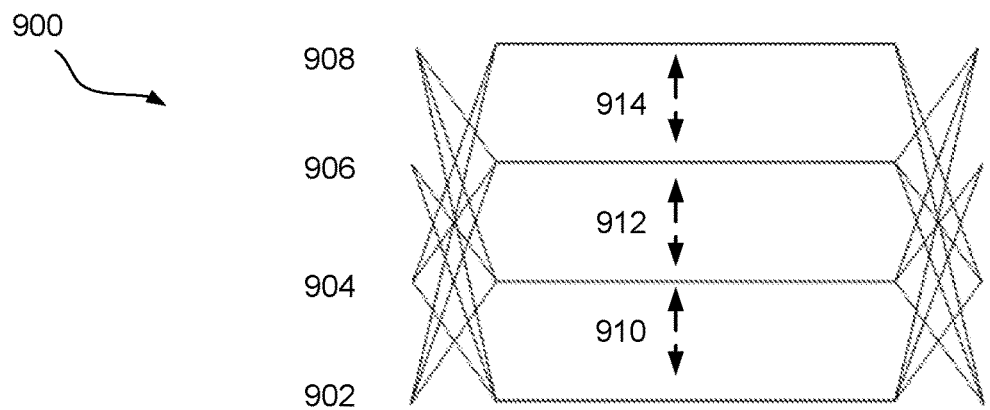
FIGS. 9A, 9B, and 9C illustrate eye diagrams of an output signal of an output driver according to some embodiments of the present disclosure.
Figure 9B:
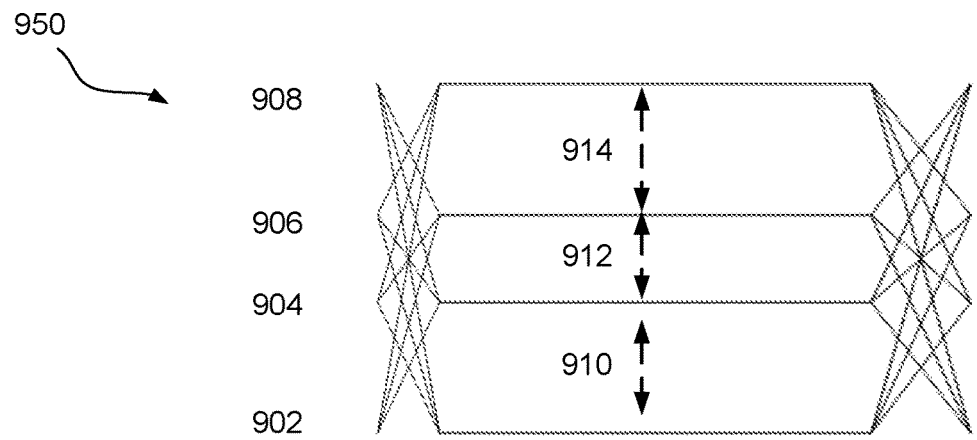
Figure 9C:
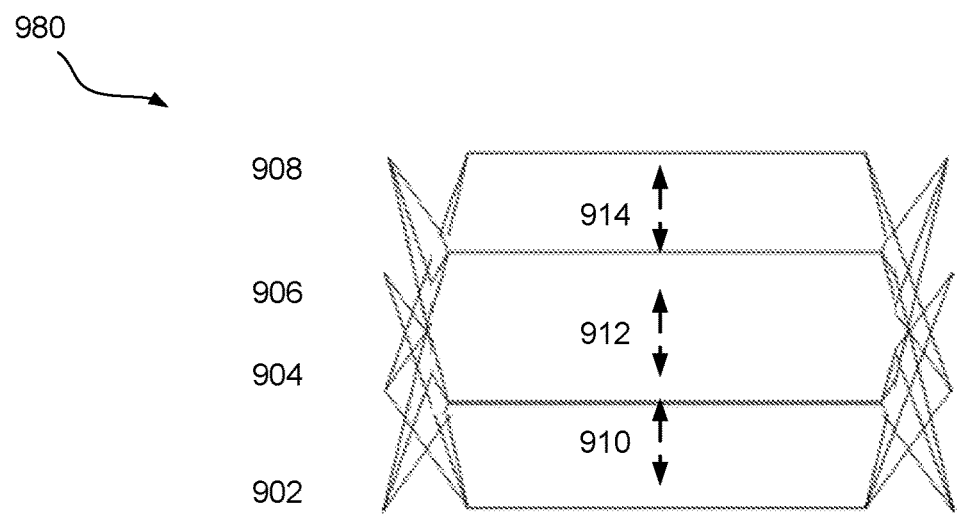

Referring to the examples of FIGS. 9A, 9B, and 9C, illustrated are eye diagrams 900, 950, and 980 of the output 316 of the output driver 218. In those examples, the output driver 218 includes the driver array 800 of FIG. 8, and the output 316 is a PAM4 signal. Referring to the example of FIG. 9A, the output 316 of an ideal PAM4 transmitter includes four voltage levels 902, 904, 906, and 908, where the intervals 910, 912, and 914 are equal. The bottom interval 910 and upper interval 914 may be referred to as outer eyes 910 and 914, and the middle interval 912 may be referred to as inner eye 912. In an example of an ideal 1 V swing PAM4 transmitter, the four voltage levels are separated by three intervals 910, 912, and 914 of 0.3333 V each.

Referring to FIG. 9B, in an example, when the transmitter is not linear, the middle interval 912 of the eye diagram 950 may be smaller than the top interval 914 and bottom interval 910. Referring to FIG. 9C, in another example, when the transmitter is not linear, the middle interval 912 of the eye diagram 980 may be greater than the top interval 914 and bottom interval 910.

In various embodiments, a Ratio of Level Mismatch (RLM) may be used to measure the linearity of the transmitter. As shown in FIGS. 9A, 9B, and 9C, the peak-to-peak swing may be determined as V908−V902. The RLM may be calculated as follows:

$$S_{min}=\text{Min}(V908-V906, V906-V904, V904-V902)/2;$$

$$RLM=(6*S_{min})/(V908-V902),$$

where V902, V904, V906, V908 are the voltage values of 902, 904, 906, and 908 respectively.

As such, RLM may be computed as follows:

$$RLM=(3*\text{Min}(V910, V912, V914))/(V908-V902),$$

where V910, V912, V914 are the voltage values of 910, 912, and 914 respectively.

In some embodiments, an RLM is equal to or greater than 0.95. In some embodiments, the RLM of a transmitter may change (e.g., to less than 0.92) over process, voltage and temperature (PVT) variations. In those embodiments, the control logic may enable or disable one or more MSB driver slices, one or more LSB driver slices, and/or a combination thereof to control the RLM.

Figure 10A:
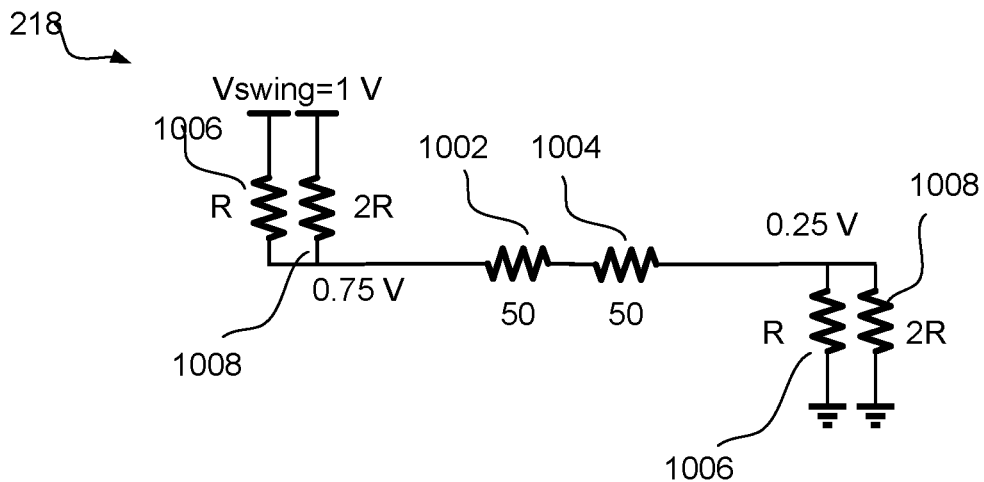
FIGS. 10A and 10B are diagrams illustrating the effective resistance of an output driver according to some embodiments of the present disclosure.
Figure 10B:
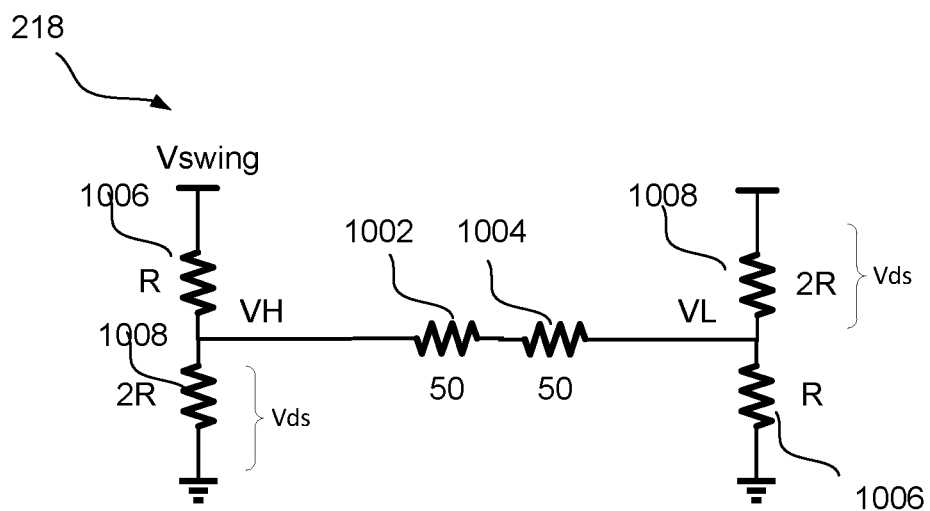

Referring to FIGS. 10A and 10B, illustrated are diagrams of the effective resistance of a PAM4 output driver 218 using driver array 800 of FIG. 8. In the examples of FIGS. 10A and 10B, the ratio between enabled MSB driver slices and enabled LSB driver slices is 2:1. Referring to FIG. 10A, in an example, when the MSB data is the same as the LSB data (e.g., "00" or "11"), the output driver 218 is terminated with 100 ohm differential resistance of external resistors 1002 and 1004. The vds across both the MSB resistor 1006 illustrating the effective MSB driver array resistance of the MSB driver array 802 (e.g., including 56 enabled MSB driver slices and having a resistance R) and LSB resistor 1008 illustrating the effective LSB driver array resistance of the LSB driver array 804 (e.g., including 28 enabled LSB driver slices and having a resistance of 2 R) are the same (e.g., 0.25 V when $V_{swing}$ is 1 V).

Referring to FIG. 10B, in an example when the MSB data is different from the LSB data (e.g., "01" or "10"), the Vds for MSB resistor 1006 is different for the Vds for LSB resistor 1008. In an example where $V_{common\_mode}$ is 0.5 V and $V_{swing}$ is 1 V, VH and VL may be computed as follows:

$$VH=V_{common\_mode}+V_{swing}/6/2=0.5\ V+1\ V/6/2=0.583\ V;$$

$$VL=V_{common\_mode}-V_{swing}/6/2=0.5\ V-1\ V/6/2=0.417\ V.$$

In various embodiments, the output driver resistance includes transistor resistance and resistor resistance. Therefore, the MSB driver array 802 and LSB driver array 804 may operate in two different $V_{ds}$ regions. In an example, the resistances of transistors (e.g. MOSFETS 604, 606, 612, 614 of a driver slice 600 or 700) depend on $V_{ds}$. For example, a resistance of a MOSFET may be highly linear at low $V_{ds}$, but increases as $V_{ds}$ increases towards the saturation region where the resistance also partly dependents on Ids, the current between drain and source of the MOSFET).

In some embodiments, as shown in FIG. 9B, the inner eye 912 is smaller than the outer eyes 910 and 914. In those embodiments, the LSB driver slices and MSB driver slices may be controlled such that the RLM is improved by increasing the inner eye 912 and decreasing the outer eyes 910 and 914. In an example, by disabling one or more LSB driver slices that are previously enabled, the effective LSB driver array resistance 1008 is increased (e.g., from 2 R to 2.05 R). As such, the current through the external resistors 1002 and 1004 (e.g., of 100 ohms) increases. This controls the RLM by increasing the inner eye 912 (e.g., the inner eye 912 of FIG. 9B). The output eyes (e.g., the outer eyes 910 and 914 of FIG. 9B) may be decreased at the same time that the inner eye 912 is increased. In another example, by enabling one or more MSB driver slices that are previously disabled, the effective MSB driver array resistance 1006 is decreased (e.g., from 1 R to 0.95 R). As such, the current through the external resistors 1002 and 1004 (e.g., of 100 ohms) increases. This controls the RLM by increasing the inner eye 912 (e.g., the inner eye 912 of FIG. 9B) by a first magnitude. The output eyes (e.g., outer eyes 910 and 914 of FIG. 9B) may be increased at the same time, and the combined increased magnitude of the output eyes is less than the first magnitude.

In some embodiments, as shown in FIG. 9C, the inner eye 912 is greater than the outer eyes 910 and 914. In those embodiments, the LSB driver slices and MSB driver slices may be controlled such that the RLM is improved by decreasing the inner eye 912. In an example, by enabling one or more LSB driver slices that are previously disabled, the effective LSB driver array resistance 1008 is decreased (e.g., from 2 R to 1.95 R). As such, the current through the external resistors 1002 and 1004 (e.g., of 100 ohms) decreases. This controls the RLM by decreasing the inner eye 912. The outer eyes 910 and 914 may be increased at the same time. In another example, by disabling one or more MSB driver slices that are previously enabled, the effective MSB driver array resistance 1006 is increased (e.g., from 1 R to 1.05 R). As such, the current through the external resistors 1002 and 1004 (e.g., of 100 ohms) decreases. This controls the RLM by decreasing the inner eye 912 by a first amplitude. The outer eyes 910 and 914 may be decreased at the same time. The combined decreased magnitude of the output eyes 910 and 914 may be less than the first magnitude.

In various embodiments, the control logic 250 controls the enabling and disabling of each of the programmable MSB driver slice(s) and LSB driver slice(s) independently (e.g., using true enable signal EN 712 and complement enable signal ENB 714). To reduce the cost of the additional gates and driving force needed, only a portion (e.g., 10% or less) of driver slices are implemented with the additional EN gates as programmable driver slices 700. In an example, MSB driver array 802 has a first ratio (e.g., between 0% and 5%) of programmable driver slices that is less than a second ratio (e.g., between 6% and 10%) of programmable driver slices of LSB driver array 804. In another example, MSB driver array 802 has a first ratio (e.g., between 6% and 10%) of programmable driver slices that is greater than a second ratio (e.g., between 0% and 5%) of programmable driver slices of LSB driver array 804. In yet another example, MSB driver array 802 and LSB driver array 804 have the same ratio (e.g., 10%) of programmable driver slices.

Figure 11:
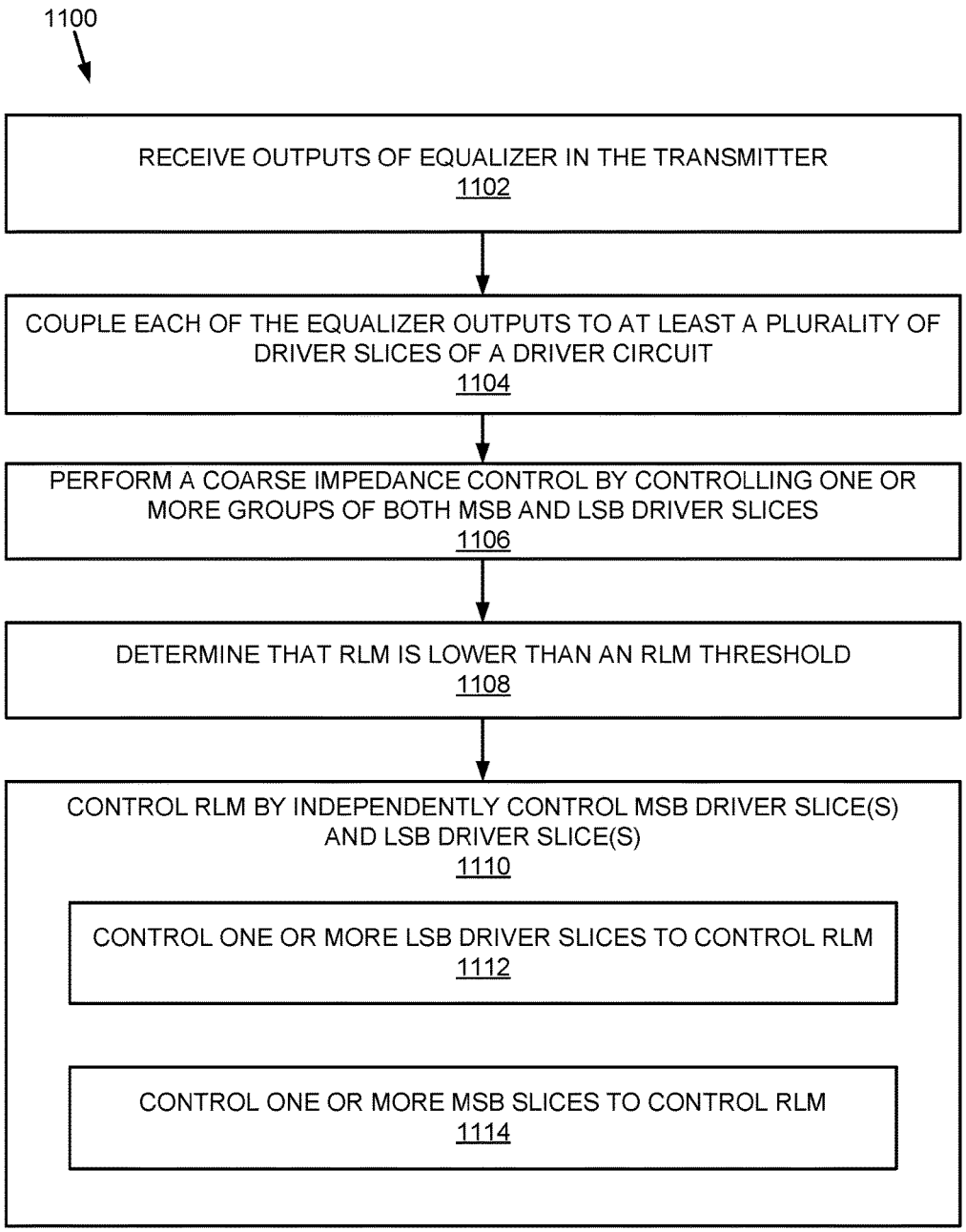
FIG. 11 is a flow chart depicting a method of controlling a driver circuit in a transmitter according to some embodiments of the present disclosure.

Referring to the example of FIG. 11, illustrated is a method 1100 for controlling an output driver circuit in a transmitter. In various embodiments, RLM is used as a key matrix for linearity of the output signal generated by the transmitter. As described below, to control the RLM, the ratio between enabled MSB driver slices and enabled LSB driver slices may have a value that equals to 2:1, less than 2:1 (e.g., 1.9:1), or greater than 2:1 (e.g., 2:0.9).

The method 1100 may begin at block 1102, where the pre-driver 215 receives the outputs of an equalizer in the transmitter 112 (e.g., FIR filter 114).

The method 1100 may proceed to block 1104, where the pre-driver 215 couples each equalizer output to one or more of a plurality of driver slices in the output driver 218 (e.g., driver slices 600 or 700). At block 1104, equalizer control may be performed independently from swing control (e.g., by controlling the voltage regulators 304-1 and 304-2), coarse impedance control, and RLM control. The main-, pre-, and postcursor signals can be coupled to any number of driver slices in the output driver 218 to achieve the desired emphasis or de-emphasis. At block 1104, for a PAM4 signal, MSB data may be used to drive the MSB driver array 802, and LSB data may be used to drive the LSB driver array 804. At block 1104, the ratio between enabled MSB driver slices of MSB driver array 802 and enabled LSB driver slices of LSB driver array 804 may be equal to 2:1.

The method 1100 may then proceed to block 1106, where a coarse impedance control is performed by controlling a group of both MSB and LSB driver slices to compensate for on-chip resistor variation. For example, one or more groups of programmable driver slices may be controlled (e.g., from enabled to disabled or vice versa) to compensate for on-chip resistor variation. Each group may include two programmable MSB driver slices 700 in an MSB cell (e.g., MSB cell 806-1) and one programmable LSB driver slice 700 in an LSB cell (e.g., LSB cell 808-1). In an example, the ratio between enabled MSB driver slices of MSB driver array 802 and enabled LSB driver slices of LSB driver array 804 may remain the same (e.g., 2:1) immediately before and after block 1106.

The method 1100 may then proceed to block 1108, where control logic 250 determines an output 316 of the output driver 218 has an RLM (e.g., 85%) that is below an RLM threshold (e.g., 92%). In response to that determination, the method 1100 may proceed to block 1110, where MSB driver slice(s) and LSB driver slice(s) may be controlled independently to control the RLM, thereby controlling the linearity of the transmitter.

In some embodiments, at block 1112, one or more programmable LSB driver slices may be controlled to switch between enabled mode and disabled mode by control logic 250 to control RLM. In an example where the inner eye 912 is smaller than the outer eyes 910 and 914, by disabling one or more LSB driver slices that are previously enabled, RLM is increased by increasing the inner eye 912. In another example where the inner eye 912 is greater than the outer eyes 910 and 914, by enabling one or more LSB driver slices that are previously disabled, RLM is increased by decreasing the inner eye 912.

In some embodiments, at block 1114, one or more programmable MSB driver slices may be controlled to switch between enabled mode and disabled mode by control logic 250 to control RLM. In an example where the inner eye 912 is smaller than the outer eyes 910 and 914, by enabling one or more MSB driver slices that are previously disabled, RLM is increased by increasing the inner eye 912. In another example where the inner eye 912 is greater than the outer eyes 910 and 914, by disabling one or more MSB driver slices that are previously enabled, RLM is increased by decreasing the inner eye 912.

Figure 12:
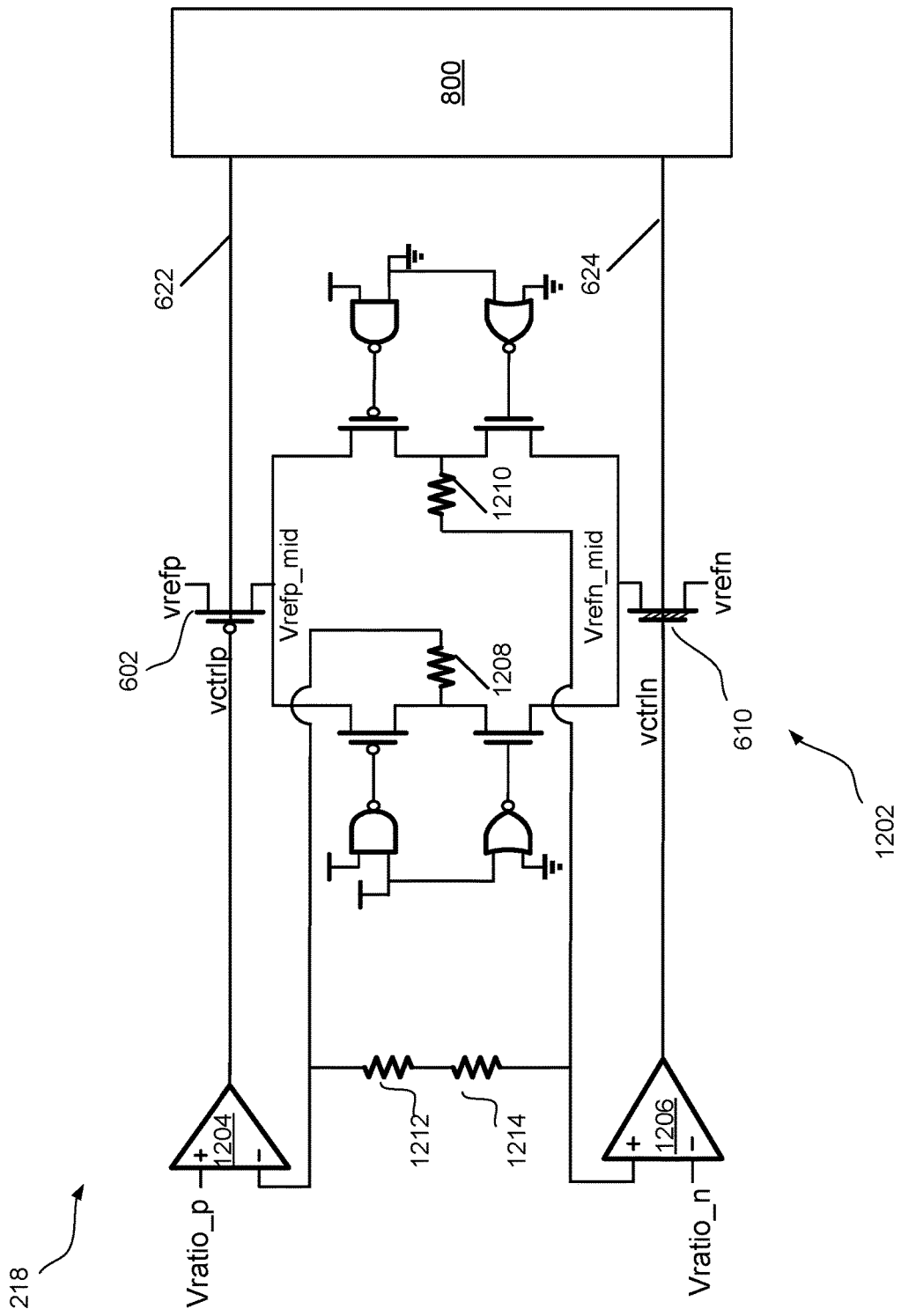
FIG. 12 is a diagram illustrating a replica circuit according to some embodiments of the present disclosure.

Referring FIG. 12, in some embodiments, the output driver 218 includes a replica circuit 1202 for impedance control of the output driver 218. In the example of FIG. 12, the replica circuit 1202 may be a replica of a driver slice (e.g., driver slice 600 or driver slice 700) except the resistances of resistors 1208 and 1210. For example, each of the resistors 1208 and 1210 may have a resistance that is determined based on the effective resistance of the driver array 800 of the output driver 218.

As shown in FIG. 12, operational amplifiers 1204 and 1206 may be used to adjust vctrlp signal 622 and vctrin signal 624 for both replica circuit 1202 and the driver slices of the driver array 800. As such, the impedance of transistors 602 and 610 of replica circuit 1202 and driver slices (e.g., driver slices 600, 700) of the driver array 800 may be controlled to match the transmission medium 260. Furthermore, the resistances of the resistors 1212 and 1214 may be determined based on transmission medium 260 and the effective resistance of the driver array 800.

It is noted that various configurations illustrated in FIGS. 2 to 12 are exemplary only and not intended to be limiting beyond what is specifically recited in the claims that follow. It will be understood by those skilled in that art that other configurations may be used. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A driver circuit, comprising:
   a driver array configured to provide, at a first output, a multi-bit output signal including a first bit associated with a predetermined first-bit amplitude and a second bit associated with a predetermined second-bit amplitude, the driver array including:
   a first plurality of first-bit driver slices coupled in parallel between a first input of first data associated with the first bit of the multi-bit output signal and the first output; and
   a second plurality of second-bit driver slices coupled in parallel between a second input of second data associated with the second bit of the multi-bit output signal and the first output;
   wherein a first ratio between a first number of enabled first-bit driver slices and a second number of enabled second-bit driver slices is different from a second ratio between the predetermined first-bit amplitude and the predetermined second-bit amplitude.

2. The driver circuit of claim 1, further comprising:
a control circuit configured to:
change an operating mode of a first programmable driver slice between an enabled mode and a disabled mode to control a linearity of the multi-bit output signal,
wherein the first programmable driver slice is one of a first-bit driver slice and a second-bit driver slice.

3. The driver circuit of claim 2, wherein the control circuit is configured to:
change an operating mode of a second programmable driver slice between an enabled mode and a disabled mode to control the linearity of the multi-bit output signal,
wherein the second programmable driver slice is the other of the first-bit driver slice and the second-bit driver slice.

4. The driver circuit of claim 2, wherein the control circuit is configured to:
change an operating mode for each programmable driver slice of a first group of programmable driver slices between an enabled mode and a disabled mode;
wherein the first group of programmable driver slices includes a third number of programmable first-bit driver slices and a fourth number of programmable second-bit driver slices, and
wherein a third ratio between the third number and the fourth number equals the second ratio.

5. The driver circuit of claim 1, wherein the multi-bit output signal is a pulse-amplitude modulation (PAM) signal.

6. The driver circuit of claim 5, further comprising:
a control circuit is configured to:
determine that a first ratio of level mismatch (RLM) of the multi-bit output signal is below an RLM threshold, and in response, adjust the first ratio between the first number of enabled first-bit driver slices and the second number of enabled second-bit driver slices.

7. The driver circuit of claim 6, wherein the multi-bit output signal is a PAM-4 signal,
wherein the first bit is a most significant bit (MSB) of the multi-bit output signal,
wherein the second bit is a least significant bit (LSB) of the multi-bit output signal, and
wherein the second ratio is 2:1.

8. The driver circuit of claim 6, wherein the first RLM is determined based on a smallest-eye amplitude of an eye diagram of the multi-bit output signal and a peak-to-peak amplitude of the eye diagram.

9. The driver circuit of claim 1, wherein the first ratio is greater than the second ratio.

10. The driver circuit of claim 1, wherein the first ratio is less than the second ratio.

11. A method, comprising:
receiving, by a first plurality of first-bit driver slices coupled in parallel between a first input and a first output from the first input, first data associated with a first bit of a multi-bit output signal;
receiving, by a second plurality of second-bit driver slices coupled in parallel between a second input and the first output from the second input, second data associated with a second bit of a multi-bit output signal; and
providing, at the first output, the multi-bit output signal including the first bit associated with a predetermined first-bit amplitude and the second bit associated with a predetermined second-bit amplitude,
wherein a first ratio between a first number of enabled first-bit driver slices and a second number of enabled second-bit driver slices is different from a second ratio between the predetermined first-bit amplitude and the predetermined second-bit amplitude.

12. The method of claim 11, further comprising:
changing an operating mode of a first programmable driver slice between an enabled mode and a disabled mode to control a linearity of the multi-bit output signal,
wherein the first programmable driver slice is one of a first-bit driver slice and a second-bit driver slice.

13. The method of claim 12, further comprising:
changing an operating mode of a second programmable driver slice between an enabled mode and a disabled mode to control the linearity of the multi-bit output signal,
wherein the second programmable driver slice is the other of the first-bit driver slice and the second-bit driver slice.

14. The method of claim 12, further comprising:
changing an operating mode for each programmable driver slice of a first group of programmable driver slices between an enabled mode and a disabled mode,
wherein the first group of programmable driver slices includes a third number of programmable first-bit driver slices and a fourth number of programmable second-bit driver slices, and
wherein a third ratio between the third number and the fourth number equals the second ratio.

15. The method of claim 11, wherein the multi-bit output signal is a pulse-amplitude modulation (PAM) signal.

16. The method of claim 15, further comprising:
determining that a first ratio of level mismatch (RLM) of the multi-bit output signal is below an RLM threshold, and in response, adjusting the first ratio between the first number of enabled first-bit driver slices and the second number of enabled second-bit driver slices.

17. The method of claim 16, wherein the multi-bit output signal is a PAM-4 signal,
wherein the first bit is a most significant bit (MSB) of the multi-bit output signal,
wherein the second bit is a least significant bit (LSB) of the multi-bit output signal, and
wherein the second ratio is 2:1.

18. The method of claim 16, further comprising:
determining the first RLM based on a smallest-eye amplitude of an eye diagram of the multi-bit output signal and a peak-to-peak amplitude of the eye diagram.

19. The method of claim 11, wherein the first ratio is greater than the second ratio.

20. The method of claim 11, wherein the first ratio is less than the second ratio.

* * * * *